(12) United States Patent
Abhyankar et al.

(10) Patent No.: US 9,989,564 B2
(45) Date of Patent: Jun. 5, 2018

(54) LOSSLESS OVER-CURRENT DETECTION CIRCUIT FOR ROYER OSCILLATORS AND PUSH-PULL CONVERTERS

(71) Applicants: MURATA MANUFACTURING CO., LTD., Nagaokakyo-shi, Kyoto (JP); MURATA POWER SOLUTIONS, Mansfield, MA (US)

(72) Inventors: Atul Abhyankar, Milton Keynes (GB); Peter Cheung, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 373 days.

(21) Appl. No.: 14/430,624

(22) PCT Filed: Oct. 9, 2013

(86) PCT No.: PCT/US2013/064033
§ 371 (c)(1),
(2) Date: Mar. 24, 2015

(87) PCT Pub. No.: WO2014/058966
PCT Pub. Date: Apr. 17, 2014

(65) Prior Publication Data
US 2015/0241484 A1    Aug. 27, 2015

Related U.S. Application Data

(60) Provisional application No. 61/711,385, filed on Oct. 9, 2012.

(51) Int. Cl.
G01R 31/02    (2006.01)
G01R 19/165    (2006.01)
(Continued)

(52) U.S. Cl.
CPC ... G01R 19/16533 (2013.01); G01R 19/0092 (2013.01); H02H 9/02 (2013.01);
(Continued)

(58) Field of Classification Search
CPC ...... H02M 1/00; H01L 21/00; H01L 2221/00; H02J 1/00; H02H 1/00; G01R 1/00; G05F 1/00; H02S 10/00
See application file for complete search history.

(56) References Cited

U.S. PATENT DOCUMENTS 4,007,401 A * 2/1977 Kimmel ............... H02H 1/00
                                                      361/95
5,675,220 A   10/1997 Dault et al.
(Continued)

FOREIGN PATENT DOCUMENTS

JP    2000-050647 A    2/2000
KR    10-2006-0027421 A    3/2006

OTHER PUBLICATIONS

Official Communication issued in International Patent Application No. PCT/US2013/064033, dated Jan. 27, 2014.

Primary Examiner — Jermele M Hollington
Assistant Examiner — Temilade Rhodes-Vivour
(74) Attorney, Agent, or Firm — Keating & Bennett, LLP

(57) ABSTRACT

A circuit including over-current protection includes a voltage input, first and second switching transistors that are complementarily switched and that receive current from the voltage input, a first resistor, a first diode including a first anode and a first cathode, and a second diode including a second anode and a second cathode. The first anode and the second anode are connected to each other and are connected to the voltage input via the first resistor. The first cathode is connected to the first switching transistor and the second cathode is connected to the second switching transistor such that the connection of the first and second anodes provides (Continued)

an over-current signal that is related to the current in the first and second switching transistors.

20 Claims, 3 Drawing Sheets

(51) Int. Cl.
    *H02M 1/32*     (2007.01)
    *H02M 3/338*     (2006.01)
    *G01R 19/00*     (2006.01)
    *H02H 9/02*     (2006.01)
    *G05F 1/00*     (2006.01)
    *H01L 21/00*     (2006.01)
    *H02M 1/00*     (2006.01)

(52) U.S. Cl.
    CPC ........... *H02M 1/32* (2013.01); *H02M 3/3382* (2013.01); *G01R 19/16547* (2013.01); *G05F 1/00* (2013.01); *H01L 21/00* (2013.01); *H02M 1/00* (2013.01); *H02M 2001/0009* (2013.01)

(56) References Cited

U.S. PATENT DOCUMENTS

| | | | | |
|---|---|---|---|---|
| 5,892,665 | A * | 4/1999 | Matsumoto | H02M 3/33507 361/18 |
| 6,130,826 | A * | 10/2000 | Matsumoto | H02M 1/36 363/21.12 |
| 9,142,952 | B2 * | 9/2015 | Yang | H02H 5/042 |
| 9,178,415 | B1 * | 11/2015 | Kost | H02M 3/157 |
| 2006/0061304 | A1 | 3/2006 | Cho et al. | |
| 2006/0250822 | A1 | 11/2006 | Nakagawa | |
| 2008/0170181 | A1 | 7/2008 | Schou et al. | |
| 2010/0295383 | A1 * | 11/2010 | Cummings | H01L 31/02021 307/151 |
| 2011/0215783 | A1 * | 9/2011 | Fukami | G05F 1/00 323/284 |
| 2012/0113551 | A1 * | 5/2012 | Huang | H02H 5/041 361/18 |

\* cited by examiner

LOSSLESS OVER-CURRENT DETECTION CIRCUIT FOR ROYER OSCILLATORS AND PUSH-PULL CONVERTERS

BACKGROUND OF THE INVENTION

1. Field of the Invention

The present invention relates to Royer oscillators and push-pull converters. More specifically, the present invention relates to an over-current detection circuit for Royer oscillators and push-pull converters.

2. Description of the Related Art

One conventional approach to monitor current in a Royer oscillator is to put a sense resistor in each half of the Royer oscillator. However, this conventional approach needs extra hardware because it requires two sense resistors for a push-pull converter, which also results in additional power loss. Further, this conventional approach has the disadvantages of being inefficient and being sensitive to noise if the sense resistors are selected to have low resistance values in order to mitigate the power loss from the sense resistors carrying a load current of the switching transistors of the Royer oscillator. Typically, when bipolar junction transistors (BJTs) are used as the switching transistors in a Royer oscillator, the sense resistors are connected between an emitter of each of the switching transistors and ground.

Another conventional approach is to add leakage inductance to the transformer of the Royer oscillator (by separating the primary and secondary windings) and to choose switching transistors with correct gains to limit the over-current. This conventional approach needs extra hardware to separate the primary and secondary windings and requires more time to manufacture. In addition, choosing the appropriate switching transistors can be complex and wasteful.

Numerous Royer oscillators are commercially available. However, many Royer oscillator-based circuits do not have short-circuit protection. Further, commercially available Royer oscillators with short-circuit protection have undesirable power loss in the over-current detection circuit.

The conventional approaches have an inherent problem of loss of efficiency because of the necessary addition of one or more sense resistors. In particular, efficiency is lost in the conventional approaches because of power loss in the sense resistor(s). Also, the addition of leakage inductance leads to more complex transformer construction and requires a careful choice of switching transistors, making the conventional approaches cumbersome to manufacture.

SUMMARY OF THE INVENTION

To overcome the problems described above, preferred embodiments of the present invention provide a Royer oscillator including a lossless over-current detection circuit to protect the Royer oscillator in response to or after detection of over-current, so as to provide short-circuit protection without undesirable power loss. The preferred embodiments of the present invention described herein can be applied to a Royer oscillator that includes a control pin to turn the Royer oscillator ON/OFF, as described in a related U.S. Provisional Patent Application No. 61/711,392, titled "CONTROL PIN AND SHORT CIRCUIT PROTECTION FOR ROYER OSCILLATORS AND PUSH-PULL CONVERTERS" and filed on Oct. 9, 2012, which is incorporated by reference in its entirety.

The preferred embodiments of the present invention provide reduced power loss in an over-current detection circuit of a power converter as compared to the conventional approaches.

The preferred embodiments of the present invention overcome the above problems of the conventional approaches. In particular, the resistors included in the preferred embodiments of the present invention do not carry a load current of the switching transistors, so as to provide lossless over-current detection. Furthermore, the preferred embodiments of the present invention are less sensitive to variations in the gains of the switching transistors, as compared to the conventional approaches. Accordingly, the preferred embodiments of the present invention provide easier selection of the switching transistors of the Royer oscillator.

A circuit including over-current protection according to a preferred embodiment of the present invention includes a voltage input, first and second switching transistors that are complementarily switched and that receive current from the voltage input, a first resistor, a first diode including a first anode and a first cathode, and a second diode including a second anode and a second cathode. The first anode and the second anode are connected to each other and are connected to the voltage input via the first resistor. The first cathode is connected to the first switching transistor and the second cathode is connected to the second switching transistor such that the connection of the first and second anodes provides an over-current signal that is related to the current in the first and second switching transistors.

The first resistor is preferably a thermistor. The first and second switching transistors are preferably bipolar junction transistors. The first and second cathodes are preferably connected to collectors of the bipolar junction transistors. The first and second switching transistors are preferably metal oxide semiconductor field effect transistors. The first and second cathodes are preferably connected to drains of the metal oxide semiconductor field effect transistors.

The circuit further preferably includes a voltage-divider circuit connected to the first and second anodes. The voltage-divider circuit preferably includes second and third resistors connected in series. Preferably, either the first or the second resistor is a thermistor. The thermistor is preferably a negative temperature coefficient thermistor. The circuit further preferably includes a filter capacitor connected in parallel with the voltage-divider circuit. The circuit further preferably includes a filter capacitor connected to the first and second anodes.

The first and second switching transistors are switched at or near a 50% duty cycle.

A circuit including over-current protection according to a preferred embodiment of the present invention includes a voltage input, a resistor, a transformer including primary and secondary windings, first and second switching transistors that are complementarily switched and that are arranged to allow current from the voltage input to flow in the primary windings, and an over-current protection circuit including a first diode including a first anode and a first cathode and a second diode including a second anode and a second cathode. The first anode and the second anode are connected to each other and to the voltage input via the resistor. The first cathode is connected to the first switching transistor and the second cathode is connected to the second switching transistor such that the connection of the first and second anodes provides an over-current signal that is related to the current in the first and second switching transistors.

The circuit further preferably includes a decoupling capacitor connected between the primary windings and ground. Preferably, the transformer further includes feedback windings, and the feedback windings drive the first and second switching transistors.

The circuit further preferably includes a voltage-divider circuit connected to the first and second anodes. The voltage-divider circuit preferably includes a thermistor. The circuit further preferably includes a filter capacitor connected in parallel with the voltage-divider circuit.

The circuit further preferably includes third and fourth diodes connected to the secondary windings so as to provide a rectified voltage output.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Figure 1:
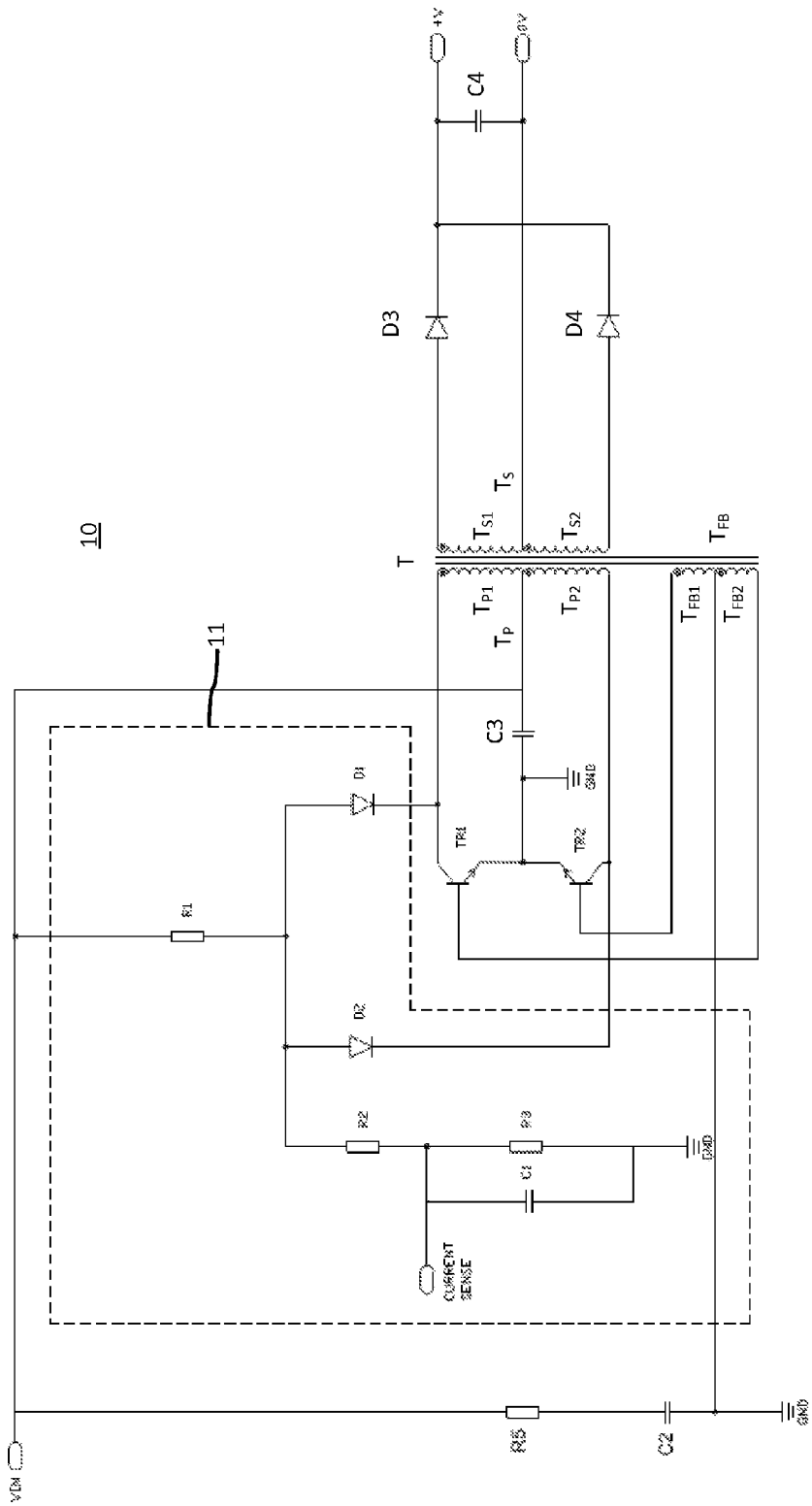
FIG. 1 is a circuit diagram of a Royer oscillator 10 equipped with a lossless over-current detection circuit 11 according to a first preferred embodiment of the present invention.
Figure 2:
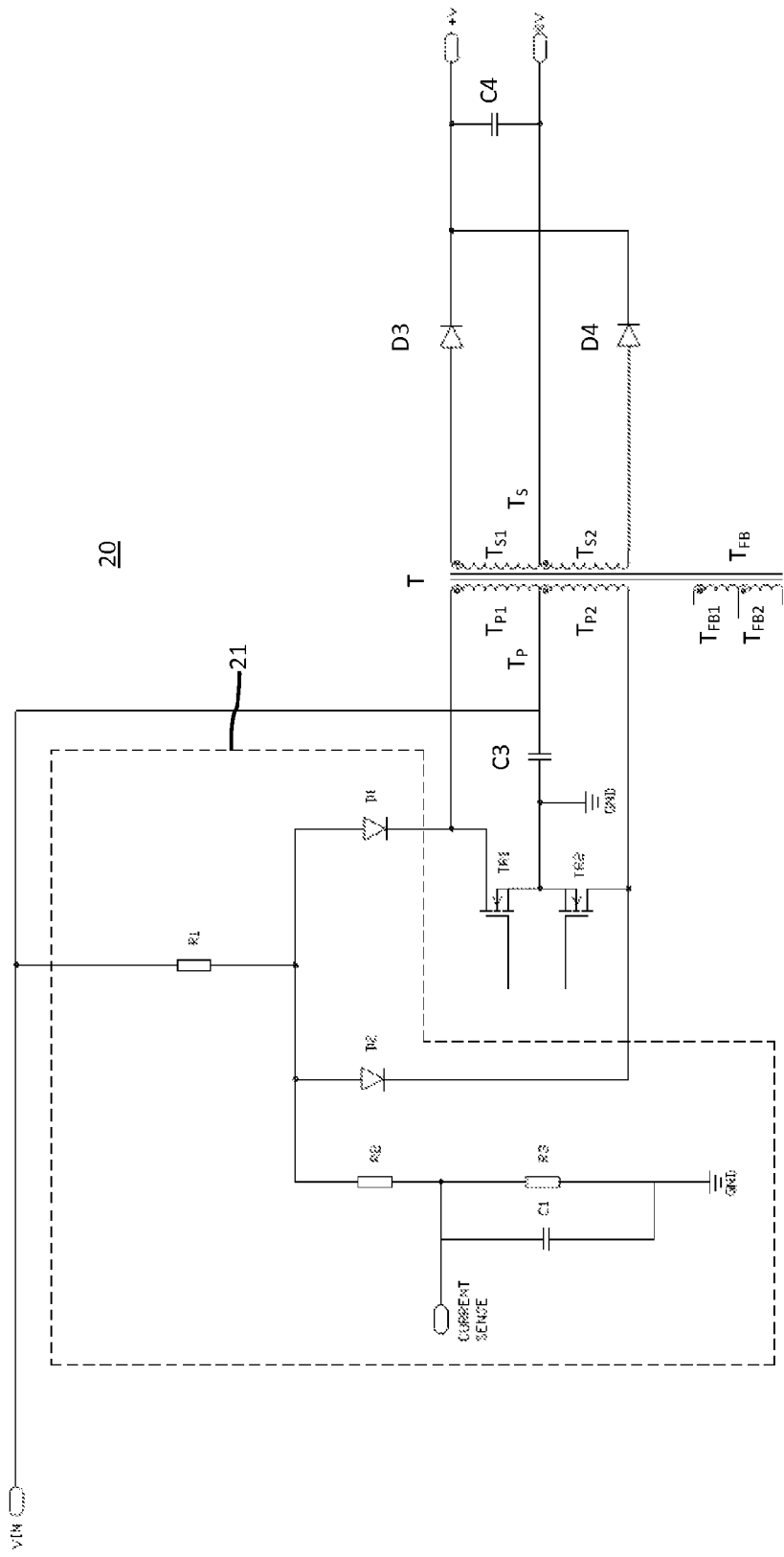
FIG. 2 is a circuit diagram of a push-pull converter 20 equipped with a lossless over-current detection circuit 21 according to a second preferred embodiment of the present invention.
Figure 3:
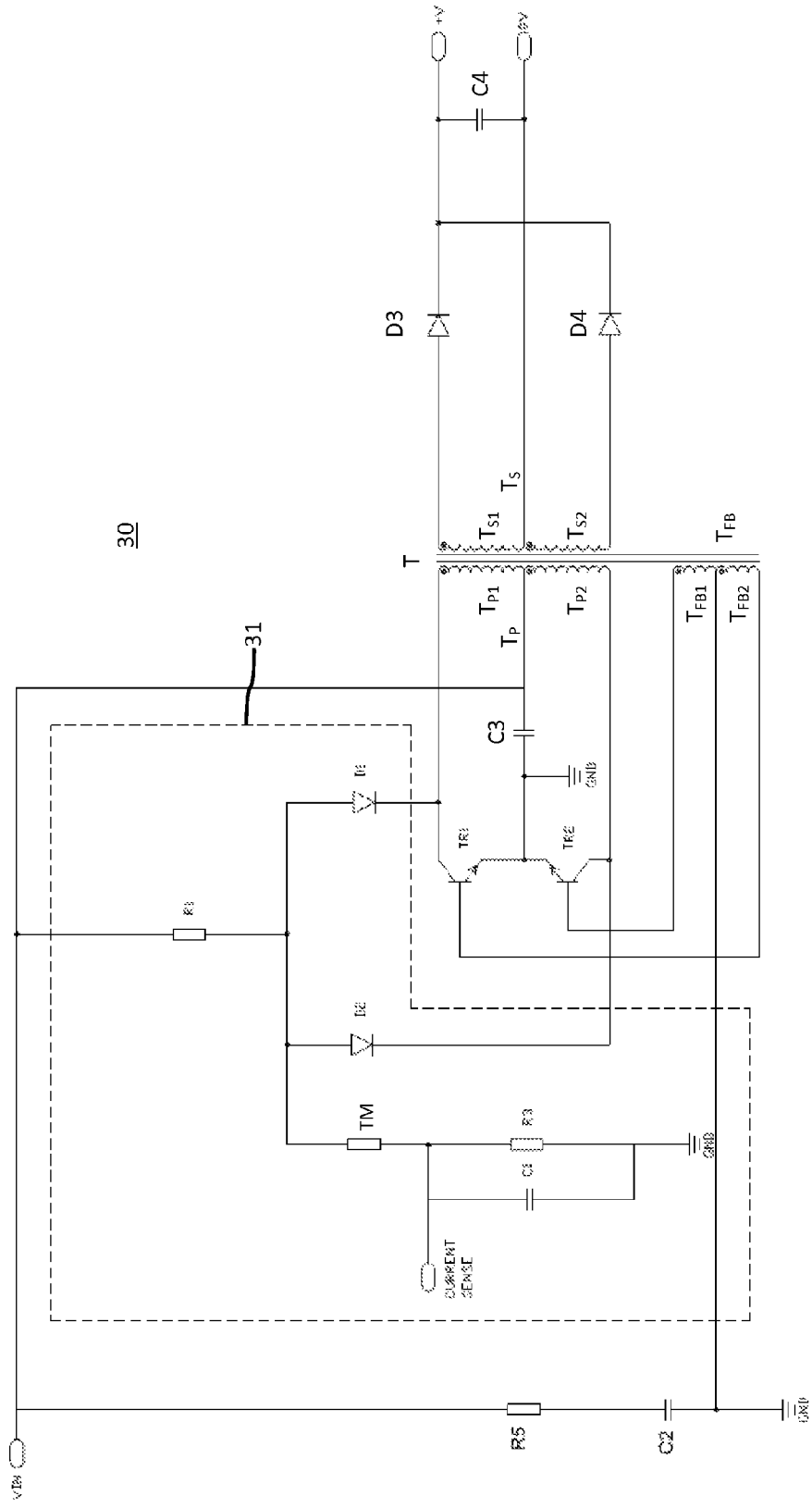
FIG. 3 is a circuit diagram of a Royer oscillator 30 equipped with a lossless over-current detection circuit 31 that includes temperature compensation according to a third preferred embodiment of the present invention.

FIGS. 1-3 show circuit diagrams of lossless overcurrent detection circuits 11, 21, 31 according to first, second, and third preferred embodiments of the present invention. The preferred embodiments of the present invention provide over-current detection circuits that sense the voltage across the terminals of a pair of switching transistors with complementary switching, i.e., switching out of phase with each other such that one switching transistor is on/off when the other switching transistor is off/on. In FIGS. 1 and 3, the over-current detection circuits 11, 31 detect the collector-emitter voltage $V_{ce}$ of the switching transistors TR1, TR2 in a Royer oscillator 10, 30, and in FIG. 2, the overcurrent detection circuit 21 detects the source-drain voltage $V_{sd}$ of the switching transistors TR1, TR2 in a push-pull converter 20. Once overcurrent is detected, a shut-down circuit (not shown in FIGS. 1-3) can disconnect the input voltage to prevent damage.

The switching transistors TR1, TR2 can be bipolar junction transistors (BJTs) or metal oxide semiconductor field effect transistors (MOSFETs), for example. If the output of the Royer oscillator or push-pull converter is short-circuited, the current through each of the switching transistors TR1, TR2 increases, and the voltages across the switching transistors TR1, TR2 increase. If the switching transistors TR1, TR2 are BJTs, the collector-emitter voltage $V_{ce}$ of each of the switching transistors TR1, TR2 increases. The increase in the collector-emitter voltage $V_{ce}$ of the switching transistors TR1, TR2 is higher than the normal collector saturation voltage $V_{cesat}$ at full load because the switching transistors TR1, TR2 come out of saturation and operate in the active region. Full load refers to the rated load of the Royer oscillator or push-pull converter such that the switching transistors TR1, TR2 operate in saturation.

The preferred embodiments of the present invention preferably include over-current detection circuits 11, 21, 31 that include two diodes D1, D2 with anodes thereof connected to provide an over-current signal. The cathodes of these diodes D1, D2 are respectively connected to the switching transistors TR1, TR2.

FIG. 1 is a circuit diagram of a Royer oscillator 10 with a lossless over-current detection circuit 11 according to a first preferred embodiment of the present invention.

The Royer oscillator 10 shown in FIG. 1 includes switching transistors TR1, TR2, transformer T, resistor R5, diodes D3, D4, and capacitors C3, C4. The transformer T includes primary windings $T_P$ and secondary windings $T_S$ and feedback windings $T_{FB}$. The primary winding $T_P$ is center tapped to form two primary windings $T_{P1}$, $T_{P2}$. The secondary winding $T_S$ is center tapped to form two secondary windings $T_{S1}$, $T_{S2}$. The feedback windings $T_{FB}$, is center tapped to form two feedback windings $T_{FB1}$, $T_{FB2}$. The resistor R5 and capacitor C2 are used to start the Royer oscillator and can also be used to sustain a drive signal to the switching transistors TR1, TR2. The capacitor C3 is an input decoupling capacitor that is arranged to reduce input ripple.

The terminals of the switching transistor TR1 are connected to the primary winding $T_{P1}$, and the terminals of switching transistor TR2 are connected to the primary winding $T_{P2}$. The feedback winding $T_{FB1}$ drives the switching transistor TR2, and the feedback winding $T_{FB2}$ drives the switching transistor TR1. The Royer oscillator is arranged in a self-oscillating arrangement such that the switching transistors TR1, TR2 are driven with a 50% duty cycle and out of phase with each other such that switching transistor TR1 is on/off when switching transistor TR2 is off/on. The Royer oscillator relies on saturation of the transformer T1 to create a quickly rising current to drive the switching transistors TR1, TR2. The voltage waveform through the primary windings $T_P$ is controlled such that an AC voltage, which is preferably a square wave, is generated at the secondary windings $T_{S1}$, $T_{S2}$. The magnitude of the AC voltage is determined by the turns ratio of the transformer T.

Diodes D3, D4 rectify the AC voltage from the transformer T into DC voltage. The rectified DC voltage is supplied to storage capacitor C4 that provides the output voltages +V, 0V. A Royer oscillator can, instead of providing a DC output voltage, supply an AC output voltage by not using diodes D3, D4 to rectify the AC voltage.

The over-current detection circuit 11 preferably includes two diodes D1, D2 with their anodes connected. The cathodes of these diodes D1, D2 are respectively connected to the switching transistors TR1, TR2 in the Royer oscillator 10. In particular, if switching transistors TR1, TR2 are BJTs, the cathodes of the diodes D1, D2 are respectively connected to the collectors of the switching transistors TR1, TR2. However, if switching transistors TR1, TR2 are MOSFETs, the cathodes of the diodes D1, D2 are respectively connected to the drains of the switching transistors TR1, TR2 as shown in FIG. 2. The anodes of the diodes D1, D2 are connected to the input voltage VIN through resistor R1. The anodes of the diodes D1, D2 are also connected to ground through series resistors R2, R3. Thus, when one of the switching transistors TR1, TR2 is turned ON, the voltage at the anode of its respective diode D1 or D2 is equal to the collector-emitter voltage $V_{ce}$ across the ON switching transistor TR1 or TR2 plus one diode drop (i.e., the forward voltage drop across a diode, which is typically approximately 0.7 volts). When one of the switching transistors TR1, TR2 is turned OFF, the voltage at the anode of its respective diode D1 or D2 is pulled to the input voltage VIN to which the anodes are connected.

As the voltage across the switching transistors TR1, TR2 increases, the voltage at the cathodes of the diodes D1, D2 increases. Accordingly, the voltage at the anode of the diodes D1, D2 increases. The voltage at the anodes is proportional to the current through the switching transistors TR1, TR2 so that the voltage can be used to provide an over-current signal.

Resistors R2, R3 are arranged to define a voltage divider that sets a voltage level of the over-current signal. Resistance values of the resistors R2, R3 can be selected according to desired voltages of the over-current signal. Resistance values of the resistors R2, R3 can also be selected based on the rated load of the Royer oscillator. A capacitor C1 is preferably used to filter out high-frequency noise which can give an incorrect reading of the over-current signal. For example, the capacitor C1 can be selected to provide a low-pass filter that rolls off at a frequency in the MHz range to remove unwanted spikes and noise from the over-current detection circuit 11.

FIG. 2 is a circuit diagram of a push-pull converter 20 equipped with a lossless over-current detection circuit 21. The over-current detection circuit 21 is preferably the same as the over-current detection circuit 11 except that the over-current detection circuit 21 is used in a different circuit: a push-pull converter 20 instead of a Royer oscillator 10. This shows that the over-current detection circuits 11, 21 can be used in circuits including a pair of switching transistors with complementary switching.

For the push-pull converter 21 with complementary switching, the feedback windings $T_{FB}$ is center tapped to form two feedback windings $T_{FB1}$, $T_{FB2}$ that drive the switching transistors TR1, TR1. Either of the two switching transistors TR1, TR2 is ON at any point in a switching cycle, except during a transition time when both switching transistors TR1, TR2 are OFF. As shown in FIG. 2, the switching transistors TR1, TR2 are preferably MOSFETs, for example. Accordingly, the voltage at the anode of each of the diodes D1, D2 will always be the source-drain voltage $V_{sd}$ of each of the switching transistors TR1, TR2 plus one diode voltage drop (i.e., the forward voltage drop across a diode, which is typically approximately 0.7 volts), except during the commutation time. However, the transition time is relatively short compared to the switching cycle, and the voltage at the anode of each of the diodes D1, D2 during the commutation time can be filtered out.

FIG. 3 shows a circuit diagram of a Royer oscillator 30 equipped with a lossless over-current detection circuit 31 that includes temperature compensation.

The resistor R2 as shown in FIGS. 1 and 2 can be replaced by an NTC (negative temperature coefficient) thermistor TM to provide temperature compensation for the over-current detection circuit. In particular, if switching transistors TR1, TR2 are BJTs, the collector-emitter voltage $V_{ce}$ lowers as the temperature increases. Accordingly, the NTC thermistor TM compensates for the temperature variation of the collector-emitter voltage $V_{ce}$ by varying the voltage at the junction of resistors R2, R3. Instead of replacing the resistor R2 with a thermistor TM, it is also possible to replace resistors R1 or R3 with a thermistor TM.

The preferred embodiments of the present invention can also provide over-temperature protection if MOSFETs are used as the switching transistors TR1, TR2. MOSFETs have a positive temperature coefficient, as the drain-to-source resistance $R_{dsON}$ of a MOSFET increases with temperature. That is, at higher temperatures, a voltage drop across the MOSFET will be higher. This higher voltage drop affects the voltage at the common anode of the diodes D1, D2, which can be used to detect an over-temperature condition. For example, as the temperature increases, the source-drain voltage $V_{sd}$ lowers and the resistance of thermistor TM decreases. Accordingly, the voltage at the junction of thermistor TM and resistor R3 will increase, and thus an over-current signal can be generated in response to an over-temperature condition.

The preferred embodiments of the present invention can be applied to other circuits to provide the same functionality as the Royer oscillator or push-pull converter. The over-current detection according to the preferred embodiments of the present invention can be applied to various switching converters, for example, flyback or forward converters.

The preferred embodiments of the present invention can be applied to any push-pull converters that include BJTs or MOSFETs and operate at full duty cycle (i.e., at or near 50% duty). Full duty cycle is preferred because, when both of the switching transistors are OFF, an over-current condition can be detected because the collector-emitter voltage $V_{ce}$ or source-drain $V_{sd}$ across the switching transistors being twice the input voltage Vin.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A circuit including over-current protection comprising:
   a voltage input;
   first and second switching transistors that are complementarily switched and that receive current from the voltage input;
   a first resistor;
   a first diode including a first anode and a first cathode; and
   a second diode including a second anode and a second cathode; wherein
   the first anode and the second anode are connected to each other and are connected to the voltage input via the first resistor;
   the first cathode is connected to the first switching transistor and the second cathode is connected to the second switching transistor such that the connection of the first and second anodes provides an over-current signal that is related to the current in the first and second switching transistors.

2. A circuit of claim 1, wherein the first resistor is a thermistor.

3. A circuit of claim 1, wherein the first and second switching transistors are bipolar junction transistors.

4. A circuit of claim 3, wherein the first and second cathodes are connected to collectors of the bipolar junction transistors.

5. A circuit of claim 1, wherein the first and second switching transistors are metal oxide semiconductor field effect transistors.

6. A circuit of claim 5, wherein the first and second cathodes are connected to drains of the metal oxide semiconductor field effect transistors.

7. A circuit of claim 1, further comprising a voltage-divider circuit connected to the first and second anodes.

8. A circuit of claim 7, wherein the voltage-divider circuit includes second and third resistors connected in series.

9. A circuit of claim 8, wherein either the first or the second resistor is a thermistor.

10. A circuit of claim 9, wherein the thermistor is a negative temperature coefficient thermistor.

11. A circuit of claim 7, further comprising a filter capacitor connected in parallel with the voltage-divider circuit.

12. A circuit of claim 1, further comprising a filter capacitor connected to the first and second anodes.

13. A circuit of claim 1, wherein the first and second switching transistors are switched at or near a 50% duty cycle.

14. A circuit including over-current protection comprising:
 a voltage input;
 a resistor;
 a transformer including primary and secondary windings;
 first and second switching transistors that are complementarily switched and that are arranged to allow current from the voltage input to flow in the primary windings;
 an over-current protection circuit including:
  a first diode including a first anode and a first cathode; and
  a second diode including a second anode and a second cathode; wherein
  the first anode and the second anode are connected to each other and to the voltage input via the resistor;
  the first cathode is connected to the first switching transistor and the second cathode is connected to the second switching transistor such that the connection of the first and second anodes provides an over-current signal that is related to the current in the first and second switching transistors.

15. A circuit of claim 14, further comprising a decoupling capacitor connected between the primary windings and ground.

16. A circuit of claim 14, wherein:
 the transformer further includes feedback windings; and
 the feedback windings drive the first and second switching transistors.

17. A circuit of claim 16, further comprising a voltage-divider circuit connected to the first and second anodes.

18. A circuit of claim 17, wherein the voltage-divider circuit includes a thermistor.

19. A circuit of claim 17, further comprising a filter capacitor connected in parallel with the voltage-divider circuit.

20. A circuit of claim 14, further comprising third and fourth diodes connected to the secondary windings so as to provide a rectified voltage output.

* * * * *